United States Patent [19]
Tamkin et al.

[11] Patent Number: 6,084,706
[45] Date of Patent: Jul. 4, 2000

[54] HIGH EFFICIENCY LASER PATTERN GENERATOR

[75] Inventors: John M. Tamkin; Joseph P. Donahue, both of Oro Valley, Ariz.

[73] Assignee: Etec Systems, Inc., Hayward, Calif.

[21] Appl. No.: 09/082,434

[22] Filed: May 20, 1998

Related U.S. Application Data

[60] Provisional application No. 60/052,070, Jul. 9, 1997.

[51] Int. Cl.$^7$ .................................................... G02B 23/00
[52] U.S. Cl. ........................... 359/366; 359/731; 359/208
[58] Field of Search ..................... 359/366, 731, 359/635, 742, 743, 364, 421, 196, 206, 207, 208; 348/746

[56] References Cited

U.S. PATENT DOCUMENTS

| | | | |
|---|---|---|---|
| 4,265,510 | 5/1981 | Cook | 359/366 |
| 4,293,186 | 10/1981 | Offner | 359/366 |
| 4,331,390 | 5/1982 | Shafer | 359/731 |
| 4,469,414 | 9/1984 | Shafer | 359/731 |
| 4,685,777 | 8/1987 | Hirose | 359/366 |
| 4,747,678 | 5/1988 | Shafer et al. | 359/366 |
| 4,796,038 | 1/1989 | Allen et al. | 396/548 |
| 4,796,984 | 1/1989 | Wynne | 359/731 |
| 4,852,957 | 8/1989 | Wakimoto et al. | 359/208 |
| 5,412,501 | 5/1995 | Fisli | 359/196 |

FOREIGN PATENT DOCUMENTS

| | | | |
|---|---|---|---|
| 0 269 868 | 6/1988 | European Pat. Off. | G02B 13/04 |

OTHER PUBLICATIONS

Jewell et al., "Reflective Systems Design Study for Soft X–ray Projection Lithography," *Journal of Vacuum Science and Technology* B:8:6:1519–1523 (Nov. 1, 1990).

*Primary Examiner*—Loha Ben
*Attorney, Agent, or Firm*—Skjerven, Morrill, MacPherson, Franklin & Friel LLP; David T. Millers

[57] ABSTRACT

A laser scanner includes an optical relay which reforms an image from a scan lens at a location that provides additional working distance. The optical relay contains primarily reflective elements which provide achromatic focusing for ultraviolet light. One embodiment of the optical relay has a magnifying power of about 1 and use spherical mirrors in a configuration where image distortion and aberrations cancels. A second optical relay provides a reduction in image size using aspherical mirrors such as parabolic and elliptical mirrors. An additional lens cancels distortion and aberration introduced in the second optical relay. The additional working distance allows insertion optical devices such as beamsplitters and chevron correction and autofocus optics in the optical path of the optical relay.

16 Claims, 10 Drawing Sheets

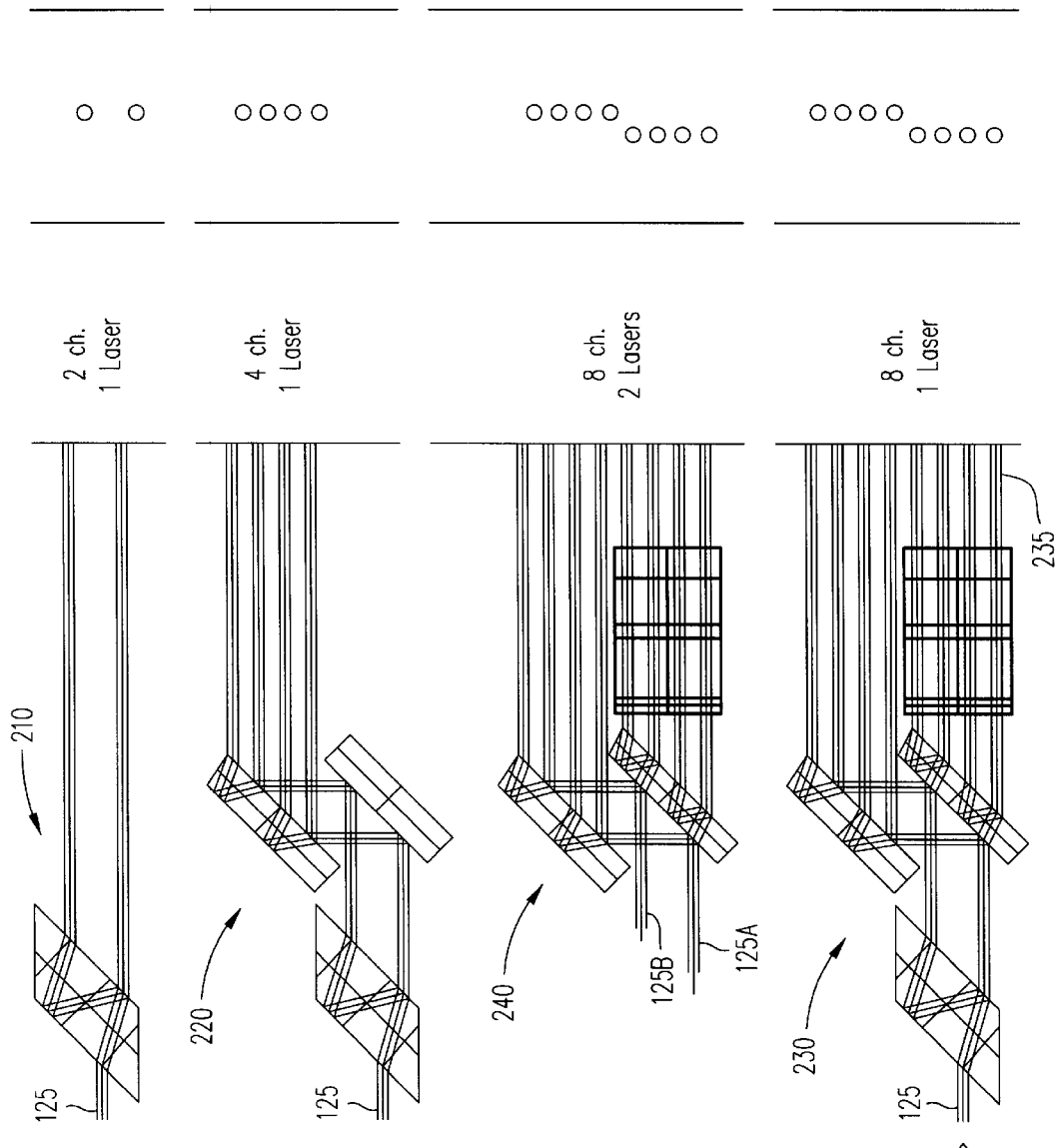

HIGH EFFICIENCY LASER PATTERN GENERATOR

CROSS REFERENCE TO RELATED APPLICATION

This patent application claims the benefit of the filing date of U.S. provisional application Ser. No. 60/052,070, filed Jul. 9, 1997.

BACKGROUND OF THE INVENTION

1. Field of the Invention

This invention relates to laser scanning systems and laser pattern generators for precision laser direct imaging and mask making.

2. Description of Related Art

In photolithography, a raster scanning system is an optical device that scans one or more laser beams into a series of scan lines covering a photosensitive layer being patterned. A typical scanning system consists of one or more modulated lasers as sources of light beams, a mechanical or other device for scanning the beams through an angle, scan optics to convert the scanned beams into a set of scanned lines, and optics for matching the scanned lines to a desired image surface. Whether a raster scanner illuminates a specific region depends on the modulation of laser beam intensity as the beam scans past the region. A laser scanner's precision in selecting illuminated regions depends on the accuracy of modulation of the laser beam, the sharpness of the focus of the laser beam, the precision with which the laser beam moves across the layer being patterned, and synchronization between modulation and motion of the laser beam.

Laser direct imagers (LDIs) form a class of laser scanning systems that can replace reticle-based large area exposure devices. Typical LDI applications require exposure of ultraviolet sensitive photoresist, and require pixel sizes ranging from 25 to 2 $\mu$m with pixel placement accuracy down to a tenth of a pixel. Scan optics for these precision imaging applications require that the optics concurrently provide diffraction-limited high resolution (low f/# or small spot size), along the scan line distortion correction, an image field suitable for accommodating multiple scan lines, and telecentric imaging. Additionally, for ultraviolet direct imaging, the system should have good radiometric efficiency. This requires that the system transmission efficiency be high. The power transfer can additionally be increased if the system can use more than one of the available UV spectral lines from a laser.

An additional requirement of the scan optics in a scanner is adequate working distance from the last optical element to the media for clearance of material handling equipment and accommodation of auxiliary optical devices. Typical auxiliary optical devices include light sensors used in synchronizing scan beam motion with scan beam intensity modulation and correction optics which reshapes or move the image of the scan line to account for movement or indexing of the device being patterned.

Related art can be found within existing UV mask making technology for semiconductor microlithography, conventional laser scanners used for printed circuit board pattern generators and for graphic art applications. For example, U.S. Pat. No. 4,796,038 describes a known pattern generator for reticle making. However, several limitations of such systems can be noted. First, systems such as described in U.S. Pat. No. 4,796,038 make reticles which does not require ultrafast write times. With a laser direct imager, time to image a substrate is of paramount importance since imaging time directly affects manufacturing cycle times. Thus, the LDI systems require high radiometric efficiency not provided in systems for making reticles. Critical system distinctions that demonstrate improvements to known systems are described below.

SUMMARY OF THE INVENTION

In accordance with the invention, a laser direct imaging system includes a continuous wave laser, a system for splitting the beam into multiple beams, a modulation system for the multiple beams, and an optical system that conditions the beams prior to entry to an f-$\theta$ scan lens, an f-$\theta$ scan lens, and an optical relay that re-images a scan line to a final focal plane. For laser direct imaging, the system has high radiometric efficiency, and uses multiple ultraviolet wavelengths in the beams. Accordingly, optics are achromatized for the ultraviolet wavelengths. In addition, the system has a predominantly reflective architecture for high transmission efficiency.

An active beam steering (ABS) system stabilizes the absolute position of the laser beam before entry into a beamsplitter assembly. The ABS stabilizes the beam angle and position, and may be used stand-alone or with a second ABS to accommodate a second laser when media sensitivity requires additional laser power. The output of the single or tandem ABS systems maintain beam parallelism with respect to the beamsplitter within one twentieth of the beam diameter, and pointing within one twentieth of the beam divergence angle.

A beamsplitter has an architecture that allows simple component replacement or removal during assembly to provide 1, 2, 4, or 8 separate beams, using either 1 or 2 lasers. In addition, the assembly is insensitive to angular alignment errors since each channel is the result of an even number of 90-degree reflections.

A primarily reflective optical system compresses the telecentric input beams into the acousto-optic modulator. A reflective system in conjunction with a fused-silica/calcium fluoride doublet provides additional beam forming of a collimated output suitable for use in any scan lens that requires a rotationally-symmetric input beam.

An optically coaxial reference timing beam is generated using an unmodulated spectral line emitted by the laser that is not used for imaging.

The output above optical system must travel through a beam rotation device, such as a dove prism. However, due to the achromatic nature of the current invention, a dove prism would introduce unacceptable optical aberration. The system uses a 3-mirror reflective assembly that creates the same optical condition as a dove prism.

The exemplary system further increases the scan line length. Prior pattern generation systems use about 4,000 pixels in a scan line. Short scan line lengths require faster polygon speeds and stage velocities than longer scan lines. The exemplary embodiment of the invention images 15,000 pixels per scan line, allowing faster imaging times when limited by stage and polygon velocities.

Absolute pixel placement accuracy is of particular concern with scan lines that have this many pixels. Prior systems addressed this issue using a precision timing grating parfocal to the image plane. An unmodulated beam is swept across the grating, and collected on a detector. This reference signal, if parfocal to the primary beam, creates a reference clock that is locked to the spatial accuracy of the grating. The exemplary embodiment employs a unique method of injecting, extracting, and imaging the reference optical signal.

The system includes an achromatic, catadioptric optical relay. The relay reforms an image from the scan optics, and provides the additional working space for insertion of optical devices including beam position error correction/ autofocus optics and a beamsplitter which directs a portion of light from the optical relay to a beam location detector. The optical relay benefits the scan lens design by easing restrictions of design criteria, namely working distance. The magnification of the scan line can be changed by using a different magnification relay, as is described below for several specific embodiments. In accordance with an aspect of the invention, the optical relay contains primarily reflective elements that provide high transmission efficiency and achromatic focusing of light suitable for photolithographic processes.

One embodiment of the invention is an optical relay that provides a magnifying power of about unity using spherical mirrors in a configuration that cancels image distortion and spherical aberration. In particular, one embodiment of the optical relay includes: a first concave spherical mirror; a convex spherical mirror in an optical path of light from the first concave mirror; and a second concave spherical mirror in an optical path of light from the convex mirror. To cancel aberrations, the first and second concave spherical mirrors have the same radius of curvature while the radius of curvature of the convex mirror is about half the radius of curvature of the concave mirrors.

Another embodiment of the invention is an optical relay that employs aspheric mirrors in conjunction with a thick meniscus lens to provides a reduced image size. An exemplary embodiment of the optical relay providing image size reduction includes: a concave parabolic mirror; a convex mirror in an optical path of light from the first concave mirror; and a concave elliptical mirror in an optical path of light from the convex mirror. An additional lens, which can be adjacent and attached to the convex mirror, corrects image distortion and aberration that may be introduced elsewhere in the optical relay. Other forms of aspheric mirrors may be used to provide different magnifications or other useful properties for the relay system.

As an example, a third embodiment of the invention is an optical relay that employs higher-order aspheres in a three-mirror configuration to provide a 2:1 expanded image size.

Embodiments of the optical relays can employ refractive field flatteners if required to compensate for curvature in the image formed by the scan optics, while maintaining telecentricity.

BRIEF DESCRIPTION OF THE DRAWINGS

FIGS. 2A, 2B, 2C, and 2D show four separate multi-channel beamsplitters usable in the scanner of FIG. 1.

Use of the same reference symbols in different figures indicates similar or identical items.

DETAILED DESCRIPTION OF THE PREFERRED EMBODIMENTS

Figure 1A:
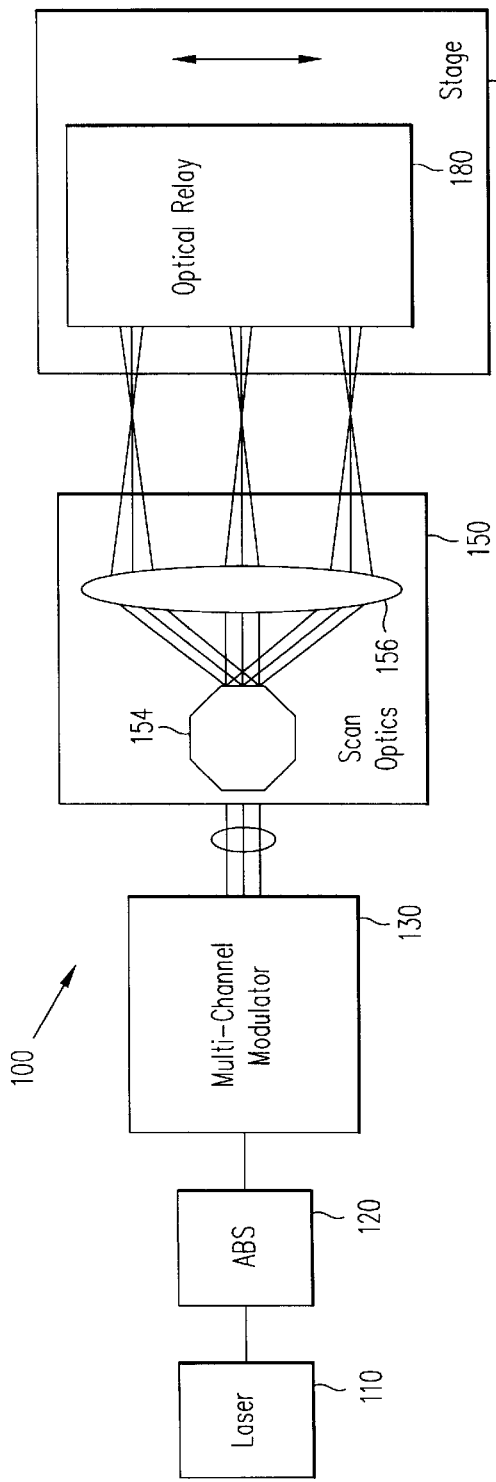
FIG. 1 shows a block diagram of a laser scanner in accordance with an embodiment of the invention.

A scanner 100 in accordance with an embodiment of the invention shown includes a laser light source 110, an active beam stabilizing (ABS) system 120, a beam conditioning and modulation system 130, scan optics 150, an optical relay 180, and a stage 190 carrying for a work piece. Laser light source 110 generates a collimated beam 115 of multi-wavelength light. In an exemplary embodiment, laser 110 is a continuous wave laser, and beam 115 has the primary spectral lines occurring at 351 nm, 364 nm and 380 nm. Active beam steering system 120 receives beam 115 and produces a position-stabilized beam 125 to multichannel modulator 130. In an alternative embodiment, laser light source 110 includes two lasers to provide more illumination, and two ABS systems are required for stabilization of beams from both lasers.

Stabilized beam 125 enter multi-channel modulator subsystem 130, where a beamsplitter assembly separates beam 125 into multiple, telecentric, equal power beams. FIGS. 2A, 2B, 2C, and 2D show basic components of beamsplitter configurations to provide 2, 4 or 8 telecentric beams from one or two stabilized input beams 125. Configurations 210, 220, and 230 respectively provide two, four, and eight beams from one input beam. Configuration 240 respectively provides eight beams from two input beams 125A and 125B. In each configuration 210, 220, 230, and 240, each beam undergoes a multiple of two 90° reflections.

Figure 3A:
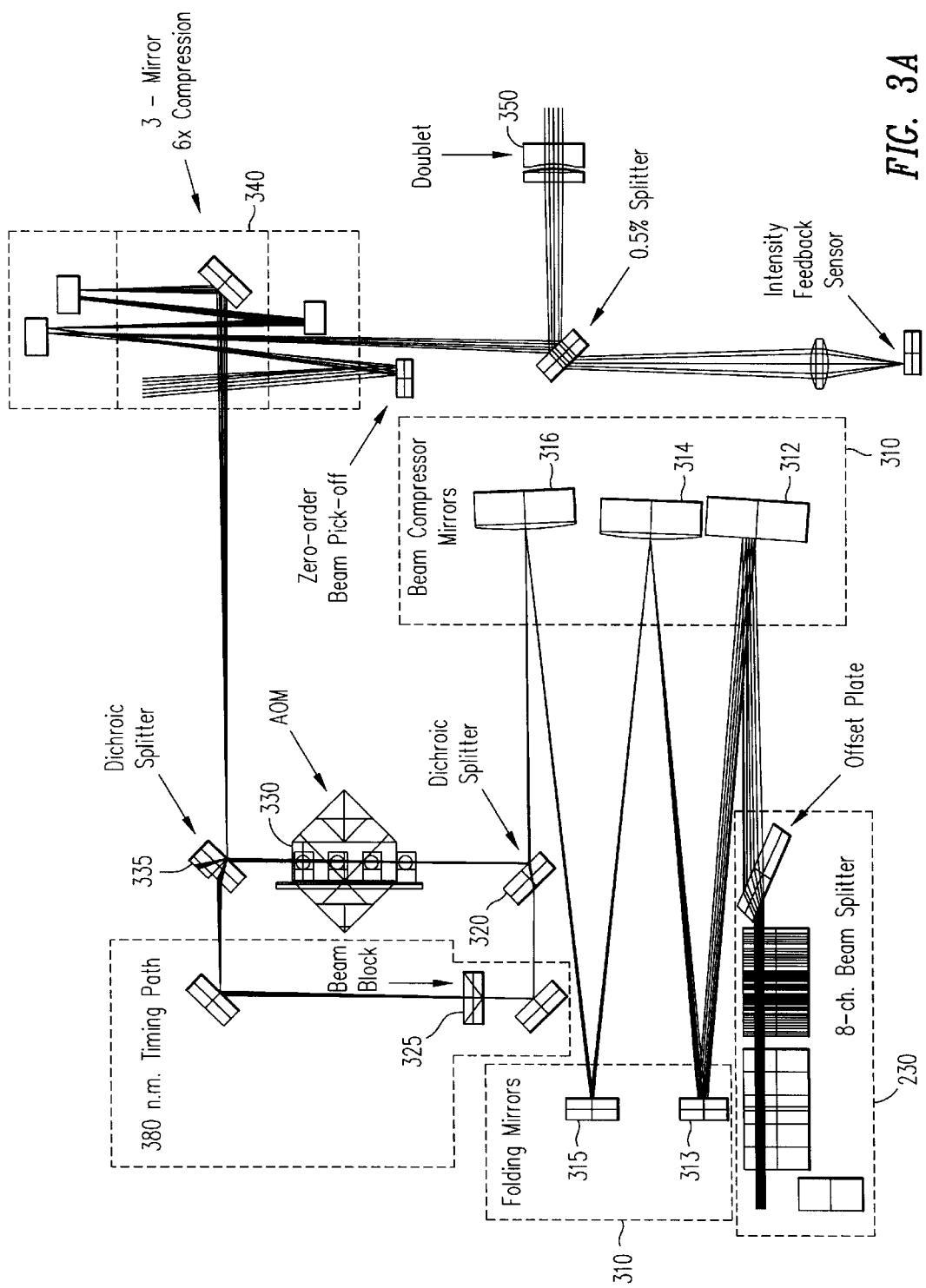
FIG. 3A shows multi-channel modulator optics for the laser scanner of FIG. 1.

Referring to FIG. 3A, exit beams 235 from configuration 230 are compressed by a factor of 11 using a 3-spherical mirror afocal optical system 310. Mirror system 310 includes two flat folding mirrors 313 and 315 to create a compact layout and three spherical mirrors 312, 314, and 316 for beam compression. A dichroic beamsplitter 320 determines the spectral characteristics of the beams that are separated from the compressed beams from optical system 310 and reflects compressed beams into the acousto-optic modulator (AOM). In the exemplary embodiment, dichroic beamsplitter 320 reflects light with wavelength 350 to 364 nm to AOM 330. A co-owned U.S. provisional patent App. No. 60/051,973 entitled "ACOUSTO-OPTIC MODULATOR ARRAY WITH REDUCED RF CROSSTALK", filed Jul. 8, 1997, describes a modulator for the exemplary embodiment of the invention. Modulation of the laser beam changes the intensities of the individual sub-beams (channels) typically turning sub-beams on and off, but gray scale control of intensities can also be employed for shaping the intensity profile of the scanned image.

Figure 3B:
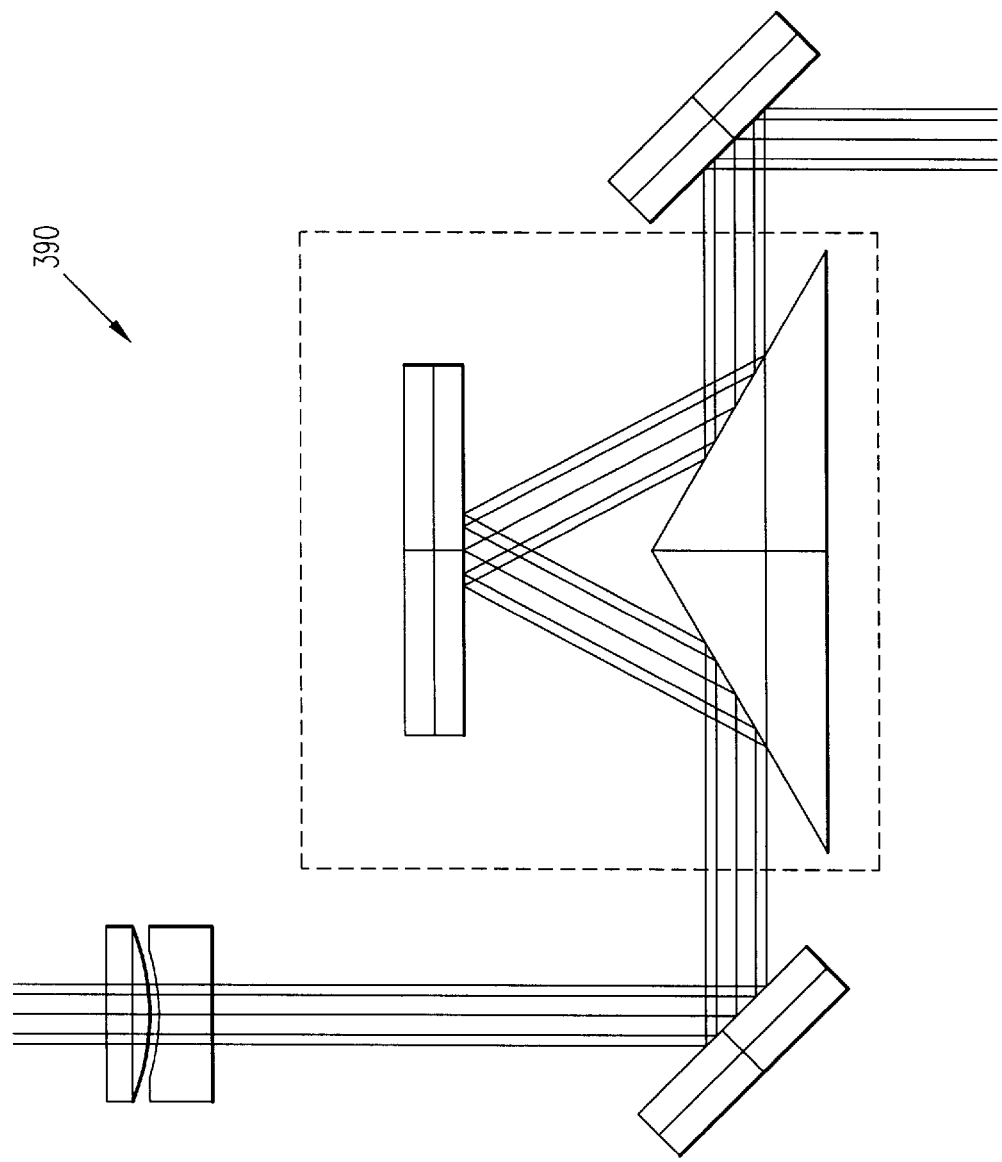
FIG. 3B shows a mirror assembly used instead of a dove prism in an embodiment of the invention.

Dichroic beamsplitter 320 transmits the 380-nm light from each of the beams. The 380-nm light is folded around AOM 330, where a beam stop 325 blocks all but one channel. The first channel (beam 1) is coaxially combined with the modulated laser light at a dichroic beamsplitter 335. The image of AOM 330 is again compressed by a factor of 6 by a second 3-spherical mirror reflective system 340. At this point, the zero-order beam is blocked, and the first order beam from AOM 330 continues and expands, to be collimated by a fused-silica/calcium fluoride doublet 350. The beam is then folded through a reflective mirror structure 390 that is shown in FIG. 3B and used to rotate the multiple channels.

Figure 1B:
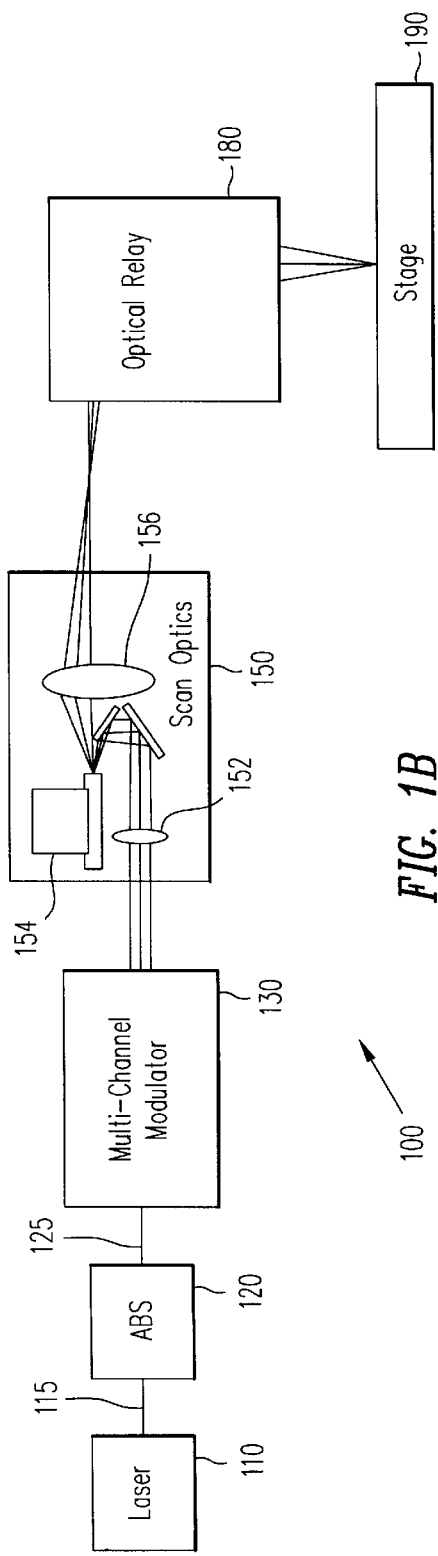

Returning to FIG. 1, scan optics system 150 includes anamorphic pre-polygon beam optics 152, a rotating polygon mirror 154, and catadioptric scan lens elements 156. To move the image along a scan direction, polygon mirror 154 rotates about an axis which changes the angles of incidence and reflection of the beams from modulator 130. Scan lens 156 focuses the beam bundle to reduce the separation between separate sub-beams and tightly focus each sub-beam. In the exemplary embodiment, scan lens 156 provides an anamorphic magnification between the scan direction and the cross-scan direction so that errors in the bearings supporting polygon mirror 154 are reduced in effect. A co-owned U.S. provisional patent application, No. 60/052, 800, entitled "Anamorphic, Catadioptric Scan Lens for Laser Scanner", which is hereby incorporated by reference in its entirety describes the operation of scan lens 156.

Optical scanning system 100 includes optical relay 180 in accordance with an aspect of the invention. Optical relay 180 reforms the image formed by scan optics 150, and may be used to reduce the constraints on certain scan lens performance requirements, allowing scan optics 150 to achieve better performance in other areas. With the exemplary embodiment described, working distance of the scan optics 150 (distance from last lens element to the focal plane) is allowed to be small (i.e., insufficient for clearance of a workpiece and other optical elements required in the system.) With this modified constraint, telecentricity, increased f# (decreased spot size), and differential distortion requirements can be met without increasing the complexity and reducing transmission efficiency of scan optics 150.

The working distance is regained without significant loss of transmission by use of the predominantly reflective relay. Increased working distance is required to accommodate stage working distance requirements, beamsplitters for optical sensors and timing systems, and/or image correction optics. Co-owned U.S. provisional patent application, No. 60/051,974, entitled "Chevron Error Correction for Bi-directional Raster Scanning", filed Jul. 8, 1997, which is hereby incorporated by reference in its entirety describes image correction optics which may be inserted in the optical path of optical relay 180. In addition to increased working distance, relay 180 can scale the spot size and length of the scan line to match the system performance requirements. Three specific embodiments of relays are described are described below. Of particular note is the implementation of beamsplitters and sensors used to create system timing.

Figure 4A:
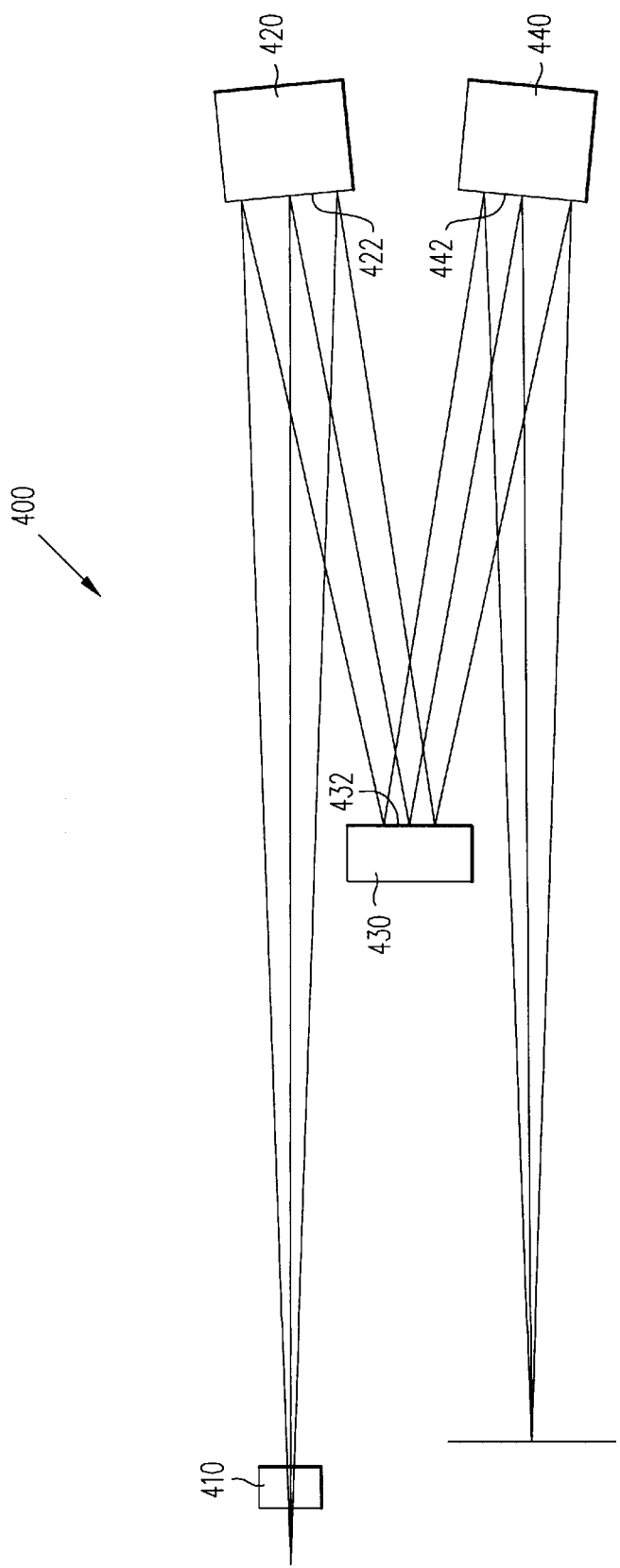
FIGS. 4A and 4B respectively show a side and perspective view ray trace diagrams of a 1:1 optical relay in accordance with an embodiment of the invention.
Figure 4B:
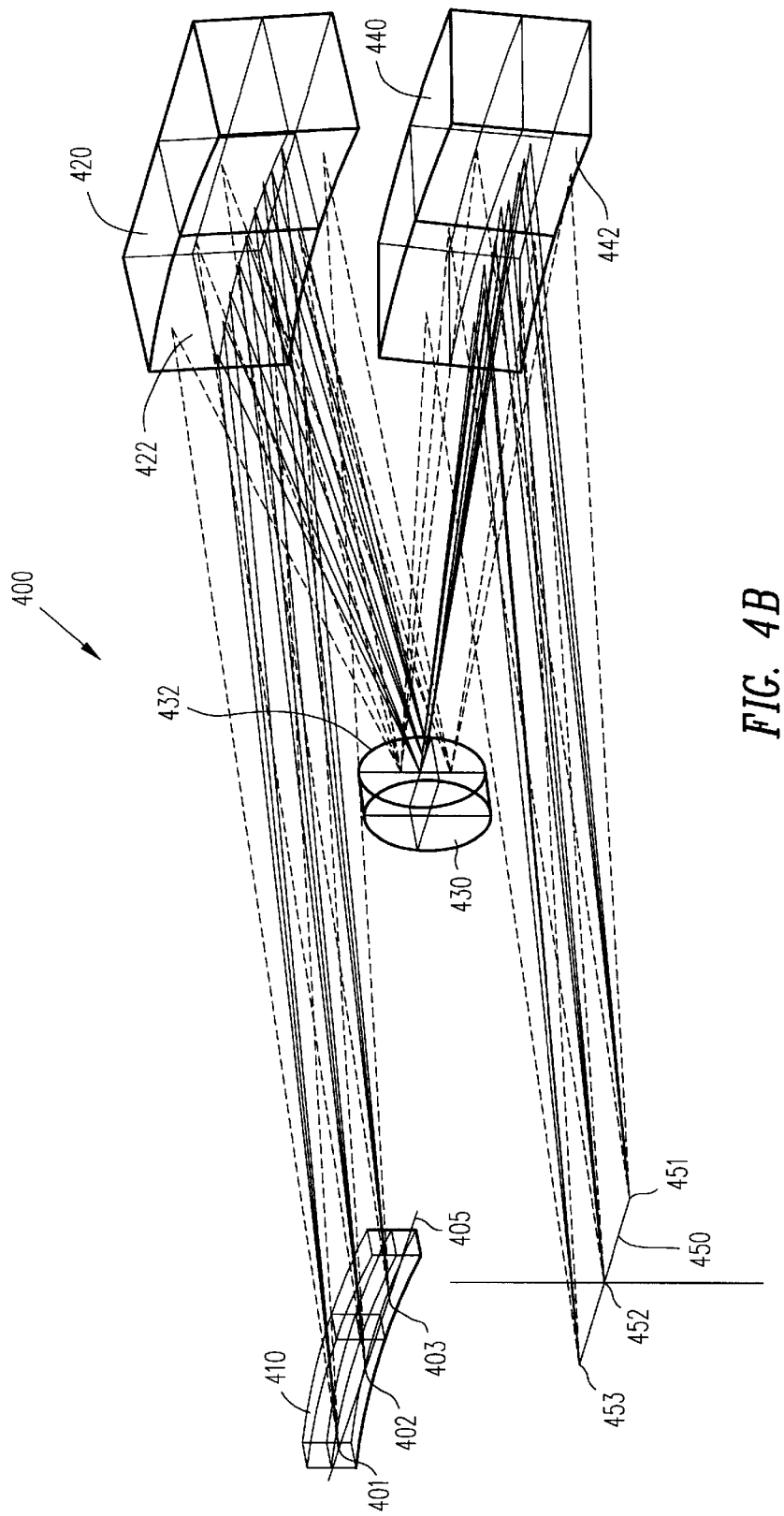

FIGS. 4A and 4B shows an exemplary embodiment of an optical relay 400. Optical relay 400 has magnifying power of about 1 and is sometimes referred to herein as a 1:1 optical relay. The object for optical relay 400 is the image formed by the scan lens. Accordingly, the object moves during scanning. FIG. 4B shows rays emerging from three separate object locations 401, 402, and 403 on a line 405.

Optical relay 400 includes a field flattener (lens) 410, a first concave spherical mirror 420, a convex spherical mirror 430, and a second concave spherical mirror 440. Field flattener 410 compensates for field curvature which may exist along line 405 where the scan lens forms images. Divergent rays from field flattener 410 are incident on a surface 422 of concave spherical mirror 420 which reflects the rays onto surface 432 of convex spherical mirror 430. Rays which are converging upon incidence to convex mirror 430 are divergent after reflection from surface 432. A surface 442 of concave mirror 440 focuses the divergent rays from convex mirror 430 to an image line 450. Objects at locations 401, 402, and 403 on line 405 result in images at locations 451, 452, and 453, respectively, on line 450.

The location of image line 450 relative to line 405 depends on the radii and positions of mirrors 420, 430, and 440. In an exemplary, embodiment of the invention, concave mirrors 420 and 440 have the same radius of curvature, and mirror 430 has a radius that is about half the radius of mirror 420 or 440. In this exemplary embodiment, spherical aberrations from the spherical mirrors 420, 430, and 440 cancel each other. Other critical parameters include the angle subtended by mirrors 420 and 440 from line 405 and 450 respectively and the angle between mirrors 420 and 440 with mirror 430 at a vertex. These angles control the size of the scan field and the speed (f number) of optical relay 400.

Figure 5:
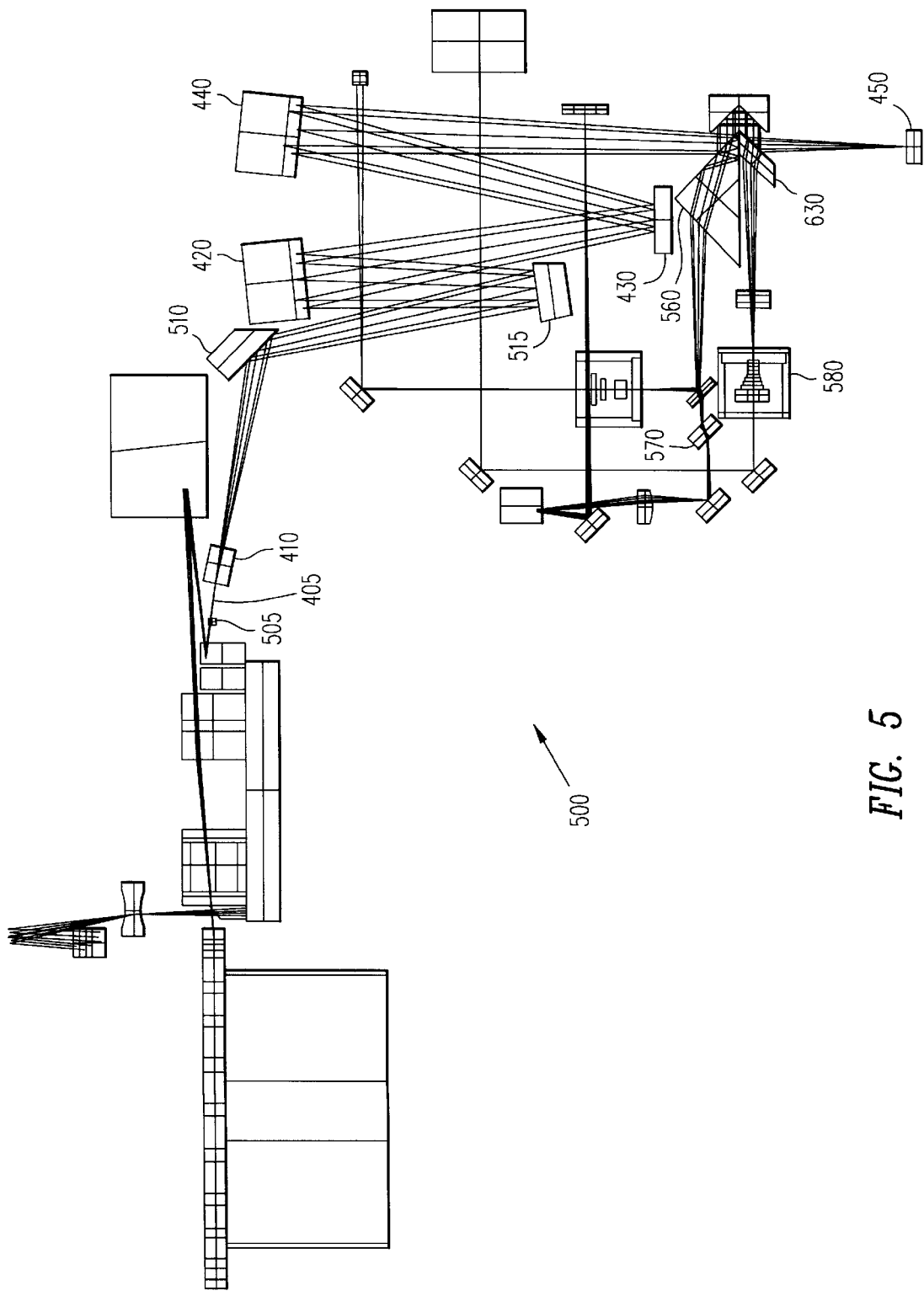
FIG. 5 shows an embodiment of the invention in which the relay of FIG. 4A is incorporated within a complete scanner system to provide additional working distance between the scan optics to the final image.

FIG. 5 illustrates an application of optical relay 400 in a scanner 500. As shown in FIG. 5, line 405 is relatively close to an optical element 505 of the scan lens which forms an image at line 405 so that there is insufficient workings space between element 505 and line 405 for insertion of optical devices. Accordingly, optical relay 400 is employed to reform the image on line 450. Field flattener 410 directs diverging light from line 405 to folding mirrors 510 and 515. Folding mirrors 510 and 515 are positioned according to the available geometry of scanner 500 and direct light from field flattener 410 to concave mirror 420. From concave mirror 420, light passes to convex mirror 430 and then concave mirror 440 which focuses the light.

The distance from mirror 440 to image line 450 is much greater than the distance between optical element 505 and line 405. This allows optical elements such as beamsplitters, a chevron correction prism 560, and autofocus optics to be inserted into the optical path in optical relay 400 between element 440 and the final image plane 450. FIG. 5 illustrates the impact of adding these elements to the system.

Figure 6:
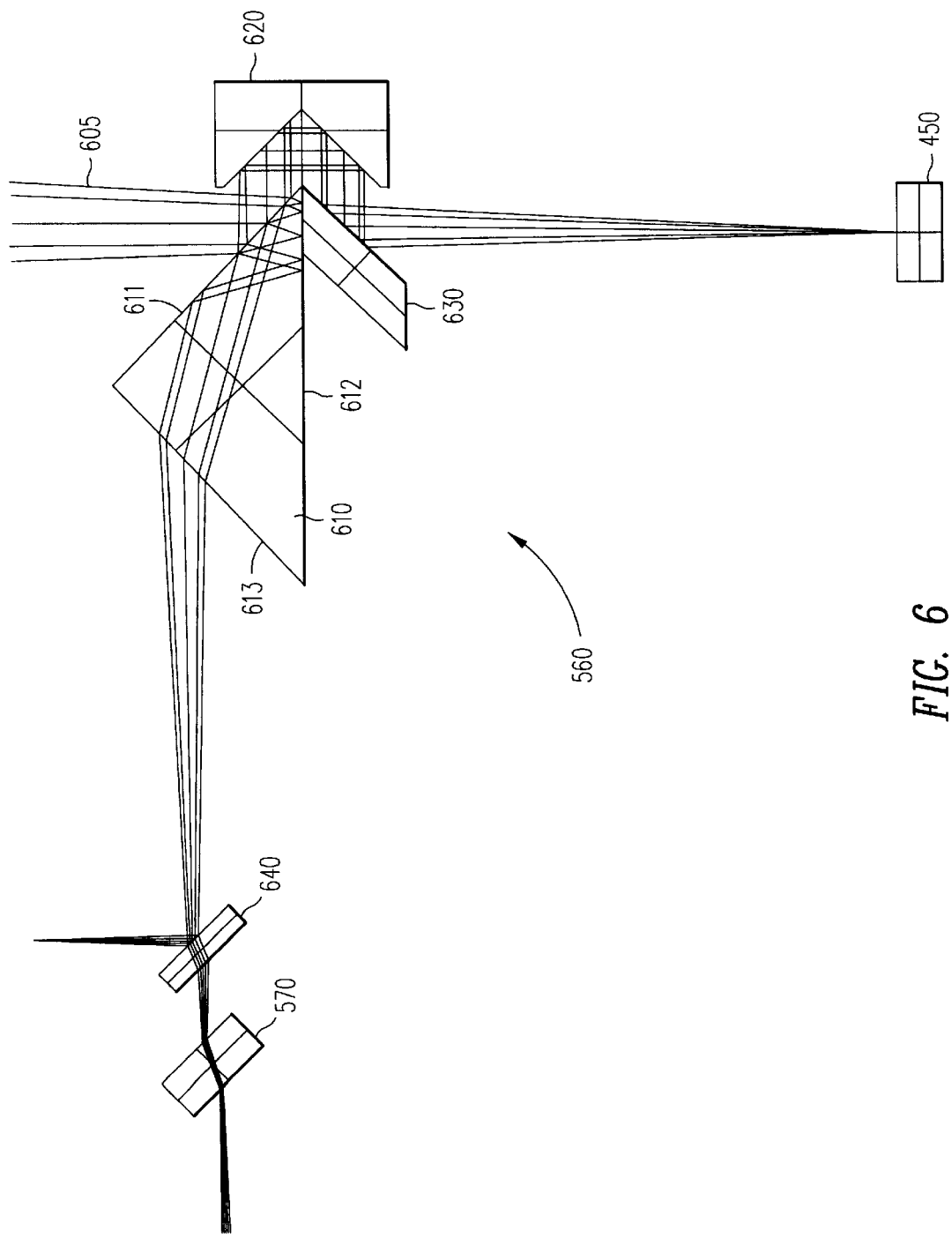
FIG. 6 shows a detail in optics that directs an unmodulated beam to a parfocal image plane that contains a timing grating.

FIG. 6 shows a chevron prism 560. In chevron prism 560, an input beam 605 is incident on a prism 610. A primary write beam (350–364 nm light) reflects off of a surface 611 which transmits the unmodulated optical timing signal whose wavelength is 380 nm. This timing signal reflects off of base 612 of the prism 610. The reflected rays then reflect (through Total Internal Reflection) off of the incident surface 611, and out through surface 613. The bundle forms a tilted line focus (parallel to the grating lines) on the timing grating, 570. This prism fold technique has two advantages. First, the package size is conserved. Second, the line focus on the grating will integrate out the effects of defects and small dust particles on the chrome-on-glass grating, providing a more robust timing system. In addition to the timing grating, the timing system utilizes a start-of-scan detector that receives part of the light off of beamsplitter 640.

Chevron correction system and a chevron sensor system includes of a 0.5% transmissive final fold mirror 630, a magnifying UV objective lens, and a CCD camera 580 for sensing position and focus of the beam at a parfocal yet magnified image plane.

Figure 7:
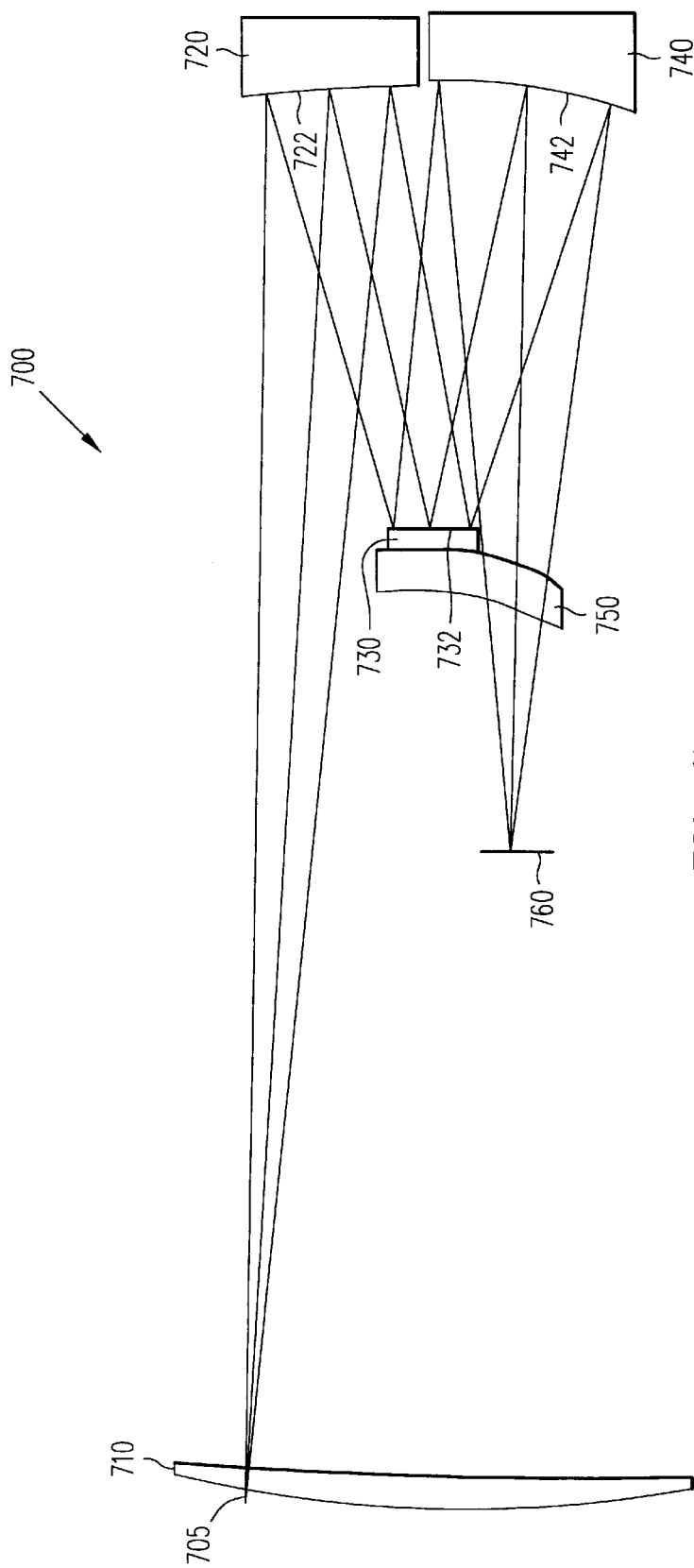
FIGS. 7 and 8 show two relay embodiments usable in the scanner of FIG. 1.

Optical relay 180 can also reduce the image size to provide a higher resolution scan beam. FIG. 7 illustrates an optical relay 700 which has a magnification less than 1 and reduces the image size. Optical relay 700 includes a field flattener (lens) 710, a first aspherical concave mirror 720, a convex mirror 730, a second aspherical concave mirror 750, and a meniscus lens 750. Field flattener 710 balances distortion errors and field curvature created by the scan lens which forms an image on line 405. Line 705 is located near an edge of field flattener 710 which allows field flattener 710, convex mirror 730, and lens 750 to have a common optical axis.

Light from field flattener 710 is incident on a surface 722 of aspherical concave mirror 720 which in an exemplary embodiment of the invention, has a parabolic surface 722. Mirror 720 directs light to mirror 730 which has a diameter that defines a stop size for relay 700. Rays which are convergent after reflection from surface 722 are divergent after reflection from convex mirror 730. Aspherical concave mirror 740 and lens 750 focus the light reflected by convex mirror 730. In the exemplary embodiment, mirror 740 has an elliptical surface 742, and lens 750 corrects for image distortion and aberrations created in optical relay 700. The specific aspheric required to correct image errors and distortion will depend upon the magnification of the relay lens.

Figure 8:
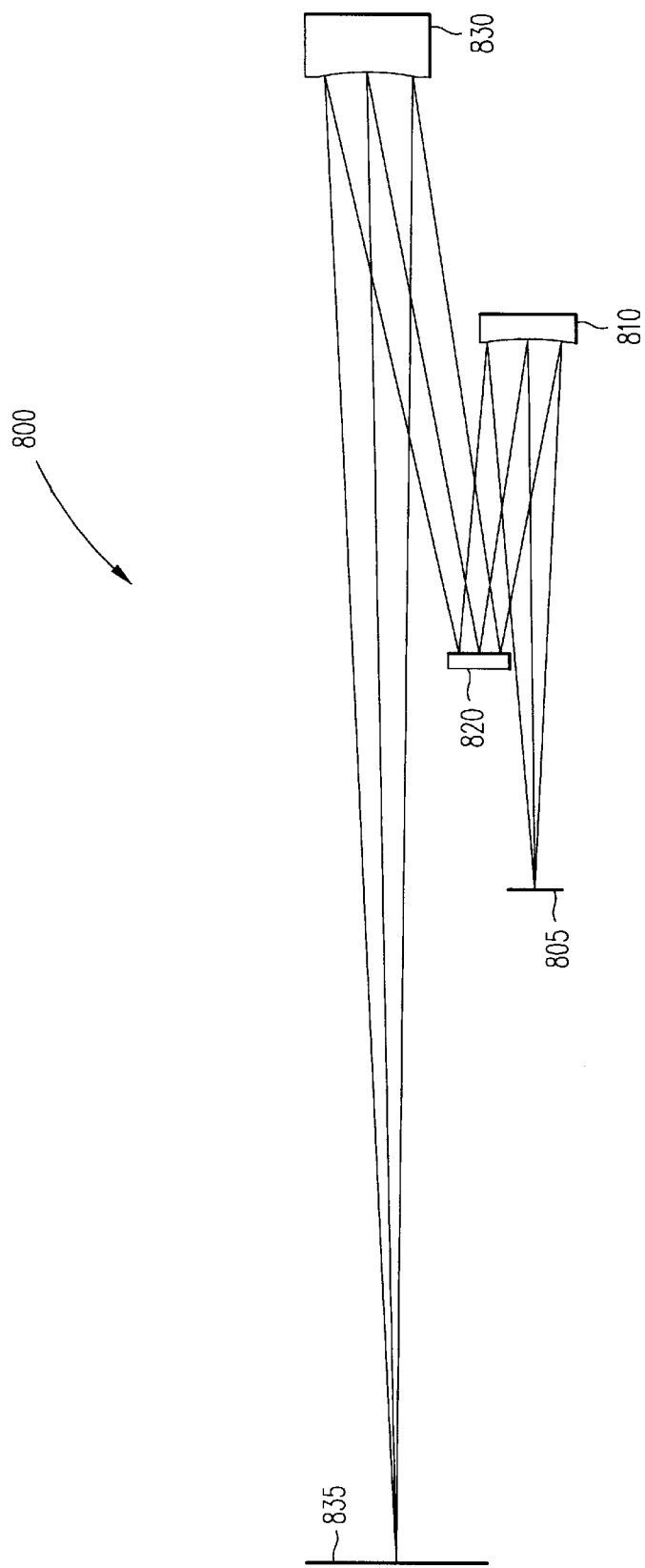

FIG. 8 shows a magnifying optical relay 800 which is entirely reflective for high transmission efficiency. Optical relay 800 includes a first concave aspheric mirror 810 which receives light from an image 805 of a scan lens, a convex spherical mirror 820, and a second concave aspheric mirror 830 which focuses the final image 835. To provide the necessary corrections for field curvature, aspheric mirrors 810 and 830 can be higher-order aspheres, for example fifth order aspheres in an exemplary embodiment. The appendix provides a "Code V" lens prescription listing of the surface parameters for a 1:2 magnifying optical relay of FIG. 8.

The appendix also provides "Code V" lens prescription listings of the surface parameters for the 1:1 relay of FIGS. 4A and 4B, and a 2.5:1 reducing optical relay of FIG. 7.

Although the invention has been described with reference to particular embodiments, the description is only an example of the invention's application and should not be taken as a limitation. Various adaptations and combinations of features of the embodiments disclosed are within the scope of the invention as defined by the following claims.

1:1 Reduction Afocal Relay

|     |     | RDY        | THI      | RMD    | GLA            | CCY | THC | GLC |
|-----|-----|------------|----------|--------|----------------|-----|-----|-----|
| OBJ |     | INFINITY   | 0.000000 |        |                | 100 | 100 |     |
| 1   |     | INFINITY   | 0.000000 |        |                | 100 | 100 |     |
| 2   |     | INFINITY   | 0.000000 |        |                | 100 | 100 |     |
| 3   |     | INFINITY   | 0.000000 |        |                | 100 | 100 |     |
| 4   |     | INFINITY   | 0.500065 |        |                | 100 | 100 |     |
| 5   |     | −724800    | 0.316136 |        | SILICA_SPECIAL | 100 | 100 |     |
|     | TRN | 0.99900    | 0.99900  |        | 0.99900        |     |     |     |
| 6   |     | −7.13400   | 0.000000 |        |                | 100 | 100 |     |
| 7   |     | INFINITY   | 5.413781 |        |                | 100 | 100 |     |
|     | XDE | −1.469982 YDE | 0.000000 |     | ZDE 0.000000   |     |     |     |
|     | XDC | 100 YDC    | 100      |        | ZDC 100        |     |     |     |
|     | ADE | 0.000000 BDE | 0.000000 |      | CDE 0.000000   |     |     |     |
|     | ADC | 100 BDC    | 100      |        | CDC 100        |     |     |     |
| 8   |     | INFINITY   | 0.000000 |        |                | 100 | 100 |     |
| 9   |     | INFINITY   | 0.000000 |        |                | 100 | 100 |     |
|     | CUM | 0.000000 THM | 0.250000 GLM |  |                |     |     |     |
| 10  |     | INFINITY   | 2.338195 |        |                | 100 | 100 |     |
| 11  |     | INFINITY   | 0.000000 |        |                | 100 | 100 |     |
| 12  |     | INFINITY   | 0.000000 |        |                | 100 | 100 |     |
|     | SLB | "RFM2"     |          |        |                |     |     |     |
|     | CUM | 0.00000 THM | 0.500000 |       | GLM            |     |     |     |
| 13  |     | INFINITY   | 3.612879 |        |                | 100 | 100 |     |
| 14  |     | INFINITY   | 0.000000 |        |                | 100 | 100 |     |
|     | XDE | 1.446330 YDE | 0.000000 |      | ZDE 0.000000   |     |     |     |
|     | XDC | 100 YDC    | 100      |        | ZDC 100        |     |     |     |
|     | ADE | 0.000000 BDE | −5.604311 |     | CDE 0.000000   |     |     |     |
|     | ADC | 100 BDC    | 100      |        | CDC 100        |     |     |     |
| 15  |     | −11.60000  | 0.000006 | REFL   |                | 100 | 100 |     |
|     | SLB | "RM1"      |          |        |                |     |     |     |
|     | CUM | 0.000000 THM | 1.000000 GLM |  |                |     |     |     |
| 16  |     | INFINITY   | −5.388191 |       |                | 100 | 100 |     |
|     | XDE | 0.000000 YDE | 0.000000 |      | ZDE 0.000000   |     |     |     |
|     | XDC | 100 YDC    | 100      |        | YDC 100        |     |     |     |
|     | ADE | 0.000000 BDE | −5.604311 |     | BDE 0.000000   |     |     |     |
|     | ADC | 100 BDC    | 100      |        | BDC 100        |     |     |     |
| 17  |     | INFINITY   | −0.341993 |       |                | 100 | 100 |     |
| 18  |     | INFINITY   | 0.000000 |        |                | 100 | 100 |     |
|     | XDE | 0.014409 YDE | 0.000000 |      | ZDE 0.000000   |     |     |     |
|     | XDC | 100 YDC    | 100      |        | ZDC 100        |     |     |     |
|     | ADE | 0.000000 BDE | 11.134474 |     | CDE 0.000000   |     |     |     |
|     | ADC | 100 BDC    | 100      |        | CDC 100        |     |     |     |
| STO |     | −5.81350   | 0.000000 | REFL   |                | 100 | 100 |     |
|     | SLB | "RM2"      |          |        |                |     |     |     |
|     | CUM | 0.000000 THM | 0.400000 |      | GLM            |     |     |     |
| 20  |     | INFINITY   | 0.341993 |        |                | 100 | 100 |     |
|     | XDE | 0.000000 YDE | 0.000000 |      | ZDE 0.000000   |     |     |     |
|     | XDC | 100 YDC    | 100      |        | ZDC 100        |     |     |     |
|     | ADE | 0.000000 BDE | 11.134474 |     | CDE 0.000000   |     |     |     |
|     | ADC | 100 BDC    | 100      |        | CDC 100        |     |     |     |
| 21  |     | INFINITY   | 5.483191 |        |                | 100 | 100 |     |
| 22  |     | INFINITY   | 0.000000 |        |                | 100 | 100 |     |
|     | XDE | 0.014340 YDE | 0.000000 |      | ZDE 0.000000   |     |     |     |
|     | XDC | 100 YDC    | 100      |        | ZDC 100        |     |     |     |

-continued

|  |  |  |  |  |  |  |  |  |
|---|---|---|---|---|---|---|---|---|
|  | ADE | 0.000000 | BDE | −5.757138 | CDE | 0.000000 |  |  |
|  | ADC | 100 | BDC | 100 | CDC | 100 |  |  |
| 23 |  | −11.60000 |  | 0.000000 REFL |  |  | 100 | 100 |
|  | SLB | "RM3" |  |  |  |  |  |  |
|  | CUM | 0.000000 | THM | 1.000000 | GLM |  |  |  |
| 24 |  | INFINITY |  | 0.000000 |  |  | 100 | 100 |
|  | XDE | 0.000000 | YDE | 0.000000 | ZDE | 0.000000 |  |  |
|  | XDC | 100 | YDC | 100 | ZDC | 100 |  |  |
|  | ADE | 0.000000 | BDE | −5.757138 | CDE | 0.000000 |  |  |
|  | ADC | 100 | BDC | 100 | CDC | 100 |  |  |
| 25 |  | INFINITY |  | −6.915399 |  |  | 100 | 100 |
|  | XDE | −0.123178 | YDE | 0.000000 | ZDE | 0.000000 |  |  |
|  | XDC | 100 | YDC | 100 | ZDC | 100 |  |  |
|  | ADE | 0.000000 | BDE | 0.501616 | CDE | 0.000000 |  |  |
|  | ADC | 100 | BDC | 100 | CDC | 100 |  |  |
| 26 |  | INFINITY |  | 0.000000 |  |  | 100 | 100 |
| 27 |  | INFINITY |  | 0.000000 |  |  | 100 | 100 |
| 28 |  | INFINITY |  | −4.220250 |  |  | 100 | PIM |
| IMG |  | INFINITY |  | 0.000000 |  |  | 100 | 100 |

SPECIFICATION DATA

```
NAO        0.04000
PUX        0.75000
PUY        0.75000
PUI        0.13500
TEL
DIM        IN
WL         363.80     351.40     351.10
REF        2
WTW        100        100        100
XOB        0.00000    0.00000    0.00000
YOB        0.00000    1.00000    1.50000
VUX        0.00000    0.00000    0.00000
VLX        0.00000    0.00000    0.00000
VUY        0.00000    0.00000    0.00000
VLY        0.00000    0.00000    0.00000
PFR        1.0000    10000       1.0000
PTP        0.0000     0.0000     0.0000
POR        0.0000     0.0000     0.0000
PRO        LIN        LIN        LIN
```

APERTURE DATA/EDGE DEFINITIONS

```
CA
REX   S6    0.200000
REX   S6    1.875000
REX   S9    0.400000
REY   S9    1.875000
ADX   S9    2.700000
REX   S12   0.500000
REY   S12   2.000000
ADX   S12   1.600000
REX   S15   0.600000
REY   S15   2.075000
CIR   S19   0.550000
REX   S23   0.600000
REY   S23   2.075000
```

REFRACTIVE INDICES

```
GLASS CODE         363.80     351.40     351.10
SILICA_SPECIAL     1.474723   1.476662   1.476712
```

SOLVES
PIM
No pickups defined in system
This is a decentered system. If elements with power are decentered or tilted, the first order
properties are probably inadequate in describing the system characteristics.

INFINITE CONJUGATES

```
EFL      1514.9226
BFL     −1516.7689
FFL     −1517.3004
FNO         0.0000
```

AT U5ED CONJUGATES

```
RED         0.9984
FNO        12.4804
OBJ DIS     0.0000
TT          1.1404
IMG DIS    −4.2202
OAL         5.3607
```

-continued

PARAXIAL IMAGE

| | |
|---|---|
| HT | 1.4976 |
| THI | −4.2202 |
| ANG | 0.0000 |

ENTRANCE PUPIL

| | |
|---|---|
| DIA | 0.8006E+09 |
| THI | 0.1000E+11 |

EXIT PUPIL

| | |
|---|---|
| DIA | 121.2909 |
| THI | −1516.7687 |

CODE V > out t
CODE V > list
2.5:1 Reduction Relay

| | | RDY | THI | RMD | GLA | CCY | THC | GLC |
|---|---|---|---|---|---|---|---|---|
| OBJ | | INFINITY | 0.000000 | | | 100 | 100 | |
| 1 | | INFINITY | 0.000000 | | | 100 | 100 | |
| 2 | | INFINITY | 0.000000 | | | 100 | 100 | |
| 3 | | INFINITY | 0.017544 | | | 100 | 0 | |
| | XDE | 2.718028 | YDE | 0.000000 | | ZDE | 0.000000 | |
| | XDC | 1 | YDC | 100 | | ZDC | 100 | |
| | ADE | 0.000000 | EDE | 0.000000 | | CDE | 0.000000 | |
| | ADC | 100 | BDC | 100 | | CDC | 100 | |
| 4 | | 17.05165 | 0.450000 | | SILICA_SPECIAL | 100 | 100 | |
| | SLB | "L_1" | | | | | | |
| 5 | | 81.06929 | −1.750000 | | | 100 | 100 | |
| 6 | | INFINTTY | 9.823047 | | | 100 | 0 | |
| 7 | | INFINITY | 0.724474 | | | 100 | 100 | |
| 8 | | INFINITY | 0.000000 | | | 100 | 100 | |
| 9 | | INFINITY | 0.000000 | | | 100 | 0 | |
| | SLB | "FM_3" | | | | | | |
| | CUM | 0.000000 | THM | 0.000000 | GLM | | | |
| 10 | | INFINITY | 3.064582 | | | 100 | 100 | |
| 11 | | INFINITY | 2.000000 | | | 100 | 100 | |
| 12 | | INFINITY | 0.000000 | | | 100 | 100 | |
| 13 | | −18.01000 | −6.355217 | REFL | | 100 | 0 | |
| | SLB | "M_1" | | | | | | |
| | CON | | | | | | | |
| | K | −1.000000 | KC | 100 | | | | |
| | CUM | 0.000000 | THM | 1.000000 | GLM | | | |
| 14 | | INFINITY | 0.000000 | | | 100 | 100 | |
| STO | | −6.79736 | 6.461636 | REFL | | 100 | −1 | |
| | SLB | "M_2" | | | | | | |
| | CUM | −0.292620 | THM | 0.225000 | GLM | | | |
| 16 | | INFINITY | 0.000000 | | | 100 | 100 | |
| 17 | | −11.34300 | −6.461636 | REFL | | 100 | 1 | |
| | SLB | "M_3" | | | | | | |
| | CON | | | | | | | |
| | K | 0.079573 | KC | 0 | | | | |
| | CUM | 0.000000 | THM | 1.000000 | GLM | | | |
| 18 | | INFINITY | 0.000000 | | | 100 | 100 | |
| 19 | | INFINITY | −0.225000 | | | 100 | 100 | |
| 20 | | −3.41740 | −0.647799 | | BK7_SCHOTT | 100 | 0 | |
| | SLB | "L_2" | | | | | | |
| 21 | | −2.85677 | 0.000000 | | | 100 | 100 | |
| 22 | | INFINITY | 0.000000 | | | 100 | 100 | |
| | XDE | 1.087230 | YDE | 0.000000 | | ZDE | 0.000000 | |
| | XDC | 100 | YDC | 100 | | ZDC | 100 | |
| | ADE | 0.000000 | BDE | 0.000000 | | CDE | 0.000000 | |
| | ADC | 100 | BDC | 0 | | CDC | 100 | |
| 23 | | INFINITY | 0.000000 | | | 100 | 100 | |
| 24 | | INFINITY | 0.000000 | | | 100 | 100 | |
| 25 | | INFINITY | −3.670777 | | | 100 | PIM | |
| IMG | | INFINITY | −0.000043 | | | 100 | 100 | |

SPECIFICATION DATA

| | | | |
|---|---|---|---|
| NAO | 0.04500 | | |
| PUX | 0.75000 | | |
| PUY | 0.75000 | | |
| PUI | 0.13500 | | |
| TEL | | | |
| DIM | IN | | |
| WL | 363.80 | 351.40 | 351.10 |
| REF | 2 | | |
| WTW | 100 | 100 | 100 |

-continued

| | | | | | |
|---|---|---|---|---|---|
| XOB | −0.01000 | −0.01000 | 0.00000 | 0.01000 | 0.01000 |
| | 0.01000 | | | | |
| YOB | −1.75000 | −1.25000 | 0.00000 | 0.50000 | 0.75000 |
| | 1.50000 | | | | |
| VUX | 0.00000 | 0.00000 | 0.00000 | 0.00000 | 0.00000 |
| | 0.00000 | | | | |
| VLX | 0.00000 | 0.00000 | 0.00000 | 0.00000 | 0.00000 |
| | 0.00000 | | | | |
| VUY | 0.00000 | 0.00000 | 0.00000 | 0.00000 | 0.00000 |
| | 0.00000 | | | | |
| VLY | 0.00000 | 0.00000 | 0.00000 | 0.00000 | 0.00000 |
| | 0.00000 | | | | |
| PFR | 1.0000 | 0.0000 | 0.0000 | 0.0000 | 0.0000 |
| | 0.0000 | | | | |
| PTP | 0.0000 | 0.0000 | 0.0000 | 0.0000 | 0.0000 |
| | 0.0000 | | | | |
| POR | 90.0000 | 0.0000 | 0.0000 | 0.0000 | 0.0000 |
| | 0.0000 | | | | |
| PRO | LIN | LIN | LIN | LIN | LIN |
| | LIN | | | | |

APERTURE DATA/EDGE DEFINITIONS

CA
CIR S4       3.400000
CIR S5       3.600000
REX S13      1.250000
REY S13      1.250000
ADX S13     −1.500000
CIR S15      0.600000
REX S17      1.400000
REY S17      1.400000
ADX S17      1.400000
REX S20      1.250000
REY S20      1.250000
ADX S20      0.500000
REX S21      0.900000
REY S21      0.900000
ADX S21      0.500000

REFRACTIVE INDICES

| GLASS CODE | 363.80 | 351.40 | 351.10 |
|---|---|---|---|
| SILICA_SPECIAL | 1.474723 | 1.476662 | 1.476712 |
| BK7_SCHOTT | 1.536487 | 1.538878 | 1.538940 |

SOLVES
CODE V> list
1:2 Relay, Unfolded

| | | RDY | | THI | RMD | GLA | | CCY | THC | GLC |
|---|---|---|---|---|---|---|---|---|---|---|
| OBJ | | INFINITY | | 0.000000 | | | | 100 | 100 | |
| 1 | | INFINITY | | 9.606462 | | | | 100 | 100 | |
| | XDE | 0.849944 | YDE | 0.000000 | | ZDE | 0.000000 | | | |
| | XDC | 100 | YDC | 100 | | ZDC | 100 | | | |
| | ADE | 0.000000 | BDE | 0.000000 | | CDE | 0.000000 | | | |
| | ADC | 100 | BDC | 100 | | CDC | 100 | | | |
| 2 | | −10.94345 | | 0.000000 | REFL | | | 0 | 100 | |
| | SLB | "m1" | | | | | | | | |
| | ASP | | | | | | | | | |
| | K | 0.129314 | KC | 0 | | CCF | 100 | | | |
| | IC | YES | CUF | 0.000000 | | | | | | |
| | A | 0.000000E + 00 | B | −.125417E − 06 | | C | 0.000000E + 00 | D | 0.000000E + 00 | |
| | AC | 100 | BC | C | | CC | 100 | DC | 100 | |
| | CUM | 0.000000 | THM | 0.500000 | | GLM | | | | |
| 3 | | INFINITY | | −5.486081 | | | | 100 | 100 | |
| STO | | −7.28887 | | 0.000000 | REFL | | | 0 | 100 | |
| | SLB | "m2" | | | | | | | | |
| | CUM | 0.000000 | THM | 0.250000 | | GLM | | | | |
| 5 | | INFINITY | | 10.362644 | | | | 100 | 100 | |
| 6 | | −21.17519 | | 0.000000 | REFL | | | 0 | 100 | |
| | SLB | "m3" | | | | | | | | |
| | ASP | | | | | | | | | |
| | K | −0.209402 | KC | 0 | | CCF | 100 | | | |
| | IC | YES | CUF | 0.000000 | | | | | | |
| | A | 0.000000E + 00 | B | −.538804E−08 | | C | 0.000000E + 00 | D | 0.000000E + 00 | |
| | AC | 100 | BC | 0 | | CC | 100 | DC | 100 | |
| | CUM | 0.000000 | THM | 1.000000 | | GLM | | | | |
| 7 | | INFINITY | | −26.315719 | | | | 100 | PIM | |
| | XDE | 1.673560 | YDE | 0.000000 | | ZDE | 0.000000 | | | |
| | XDC | 100 | YDC | 100 | | ZDC | 100 | | | |

-continued

|     | ADE |         | BDE | 0.000000 |         | CDE | 0.000000 |     |     |
|-----|-----|---------|-----|----------|---------|-----|----------|-----|-----|
|     | ADC | 100     | BDC | 100      |         | CDC | 100      |     |     |
| IMG |     | INFINITY |    | 0.000000 |         |     |          | 100 | 100 |

SPECIFICATION DATA

| NAO | 0.06375 |       |       |         |         |
|-----|---------|-------|-------|---------|---------|
| PUX | 0.58800 |       |       |         |         |
| PUY | 0.58800 |       |       |         |         |
| PUI | 0.13500 |       |       |         |         |
| TEL |         |       |       |         |         |
| DIM | IN      |       |       |         |         |
| WL  | 387.00  | 365.00 | 350.00 |       |         |
| REF | 2       |       |       |         |         |
| WTW | 33      | 33    | 33    |         |         |
| INI | RAI     |       |       |         |         |
| XOB | 0.00000 | 0.00000 | 0.00000 | 0.01500 | 0.01500 |
|     | 0.01500 | 0.00000 | 0.00000 |         |         |
| YOB | −1.60000 | 1.60000 | 0.00000 | −1.60000 | 1.60000 |
|     | 0.00000 | −1.12000 | 1.12000 |         |         |
| VUX | 0.00000 | 0.00000 | 0.00000 | 0.00000 | 0.00000 |
|     | 0.00000 | 0.00000 | 0.00000 |         |         |
| VLX | 0.00000 | 0.00000 | 0.00000 | 0.00000 | 0.00000 |
|     | 0.00000 | 0.00000 | 0.00000 |         |         |
| VUY | 0.00000 | 0.00000 | 0.00000 | 0.00000 | 0.00000 |
|     | 0.00000 | 0.00000 | 0.00000 |         |         |
| VLY | 0.00000 | 0.00000 | 0.00000 | 0.00000 | 0.00000 |
|     | 0.00000 | 0.00000 | 0.00000 |         |         |

APERTURE DATA/EDGE DEFINITIONS

CA
| REX S2 |     | 0.650000  |
|--------|-----|-----------|
| REY S2 |     | 2.250000  |
| ADX S2 |     | −0.850000 |
| CIR S4 |     | 0.400000  |
| REX S6 |     | 0.925000  |
| REY S6 |     | 4.050000  |
| ADX S6 |     | 1.635370  |
| REX S2 | EDG | 0.750000  |
| REY S2 | EDG | 2.500000  |
| ADX S2 | EDG | −0.950000 |
| CIR S4 | EDG | 0.500000  |
| REX S6 | EDG | 1.050000  |
| REY S6 | EDG | 4.250000  |
| ADX 56 | EDG | 1.710000  |

No refractive materials defined in system
SOLVES
    PIM
No pickups defined in system
This is a decentered system. If elements with power are decentered or tilted, the first order properties are probably inadequate in describing the system characteristics.

INFINITE CONJUGATES

| EFL | −273.9346 |
|-----|-----------|
| BFL | 521.5540  |
| FFL | 136.9674  |
| FNO | 0.0000    |

AT USED CONJUGATES

| RED     | 2.0000    |
|---------|-----------|
| FNO     | 15.6863   |
| OBJ DIS | 0.0000    |
| TT      | −11.8327  |
| IMG DIS | −26.3157  |
| OAL     | 14.4830   |

PARAXIAL IMAGE

| HT  | 2.2400   |
|-----|----------|
| THI | −26.3157 |
| ANG | 0.0000   |

ENTRANCE PUPIL

| DIA | 0.1278E+10 |
|-----|------------|
| THI | 0.1000E+11 |

EXIT PUPIL

| DIA | 34.9979  |
|-----|----------|
| THI | 521.5540 |

We claim:

1. An optical relay comprising in order from an object to an image side:
    a field flattener;
    a first concave mirror in an optical path from the field flattener;
    a convex mirror in an optical path from the first concave mirror; and
    a second concave mirror in an optical path from the convex mirror, wherein:
        each of the first and second concave mirrors has a concave spherical surface;
        a radius of curvature of the first concave spherical mirror is the same as a radius of curvature of the second concave spherical mirror; and
        the convex mirror has a spherical surface with a radius of curvature that is about half the radius of curvature of the first concave mirror.

2. The optical relay of claim 1, wherein the optical relay has a magnifying power of about 1.

3. An optical relay comprising in order from an object to an image side:
    a field flattener;
    a first concave mirror in an optical path from the field flattener;
    a convex mirror in an optical path from the first concave mirror;
    a second concave mirror in an optical path from the convex mirror, wherein each of the first and second concave mirrors has an aspherical surface; and
    a lens in an optical path from the second concave mirror, wherein the lens corrects distortion or aberration created elsewhere in the optical relay.

4. The optical relay of claim 3, wherein:
    the aspherical surface of the first concave mirror has a parabolic cross-section; and
    the aspherical surface of the second concave mirror has an elliptical cross-section.

5. The optical relay of claim 4, wherein the optical relay has a magnifying power of less than 1.

6. A laser scanner comprising:
    a source of a spatially modulated laser beam;
    scan optics which forms an image of the spatially modulated laser beam, wherein the image has a location that moves along a first line; and
    an optical relay comprising in order from an object side to an image side:
        a field flattener positioned to receive light from the image located on the first line;
        a first concave mirror in an optical path from the field flattener;
        a convex mirror in an optical path from the first concave mirror; and
        a second concave mirror in an optical path from the convex mirror, wherein the second concave mirror forms an image having a location that moves along a second line.

7. The laser scanner of claim 6, wherein:
    each of the first and second concave mirrors has a concave spherical surface; and
    a radius of curvature of the first concave spherical mirror is the same as a radius of curvature of the second concave spherical mirror.

8. The laser scanner of claim 7, wherein the convex mirror has a spherical surface with a radius of curvature that is about half the radius of curvature of the first concave mirror.

9. The laser scanner of claim 8, wherein the optical relay has a magnifying power of about 1.

10. The laser scanner of claim 6, wherein:
    each of the first and second concave mirrors has an aspherical surface; and
    the optical relay further comprises a lens in the optical path of light reflected from the second concave mirror, wherein the lens corrects distortion or aberration created elsewhere in the optical relay.

11. The laser scanner of claim 10, wherein:
    the aspherical surface of the first concave mirror has a parabolic cross-section; and
    the aspherical surface of the second concave mirror has an elliptical cross-section.

12. The laser scanner of claim 11, wherein the optical relay has a magnifying power of less than 1.

13. A laser scanner comprising:
    a source of a spatially modulated laser beam;
    scan optics which forms a first image of the spatially modulated laser beam, wherein the first image has a location that moves along a first line;
    a beam location detector;
    an optical relay that forms from the first image, a second image having a location that moves along a second line; and
    a beamsplitter located in an optical path of the optical relay, wherein the beamsplitter separates a portion of light from the optical relay for the beam location detector.

14. The scanner of claim 13, further comprising chevron correction optics located in the optical path of the optical relay.

15. The scanner of claim 13, wherein the optical relay has a magnifying power of about 1.

16. The scanner of claim 13, wherein the optical relay has a magnifying power less than 1.

* * * * *